United States Patent
Kida et al.

[11] Patent Number: 6,141,108
[45] Date of Patent: Oct. 31, 2000

[54] POSITION CONTROL METHOD IN EXPOSURE APPARATUS

[75] Inventors: Yoshiki Kida, Kawasaki; Masahiko Okumura, Tokyo, both of Japan

[73] Assignee: Nikon Corporation, Tokyo, Japan

[21] Appl. No.: 09/258,146

[22] Filed: Feb. 26, 1999

Related U.S. Application Data

[63] Continuation of application No. 08/826,740, Apr. 4, 1997, abandoned.

[30] Foreign Application Priority Data

Apr. 4, 1996 [JP] Japan .................................. 8-108367
Apr. 3, 1997 [JP] Japan .................................. 9-100952

[51] Int. Cl.$^7$ .................................................. G01N 11/00
[52] U.S. Cl. ........................... 356/401; 356/400; 250/548
[58] Field of Search .................... 356/400, 401; 250/548

[56] References Cited

U.S. PATENT DOCUMENTS 5,894,350  4/1999  Hsieh et al .............................. 356/401

FOREIGN PATENT DOCUMENTS 62-150106  7/1987  Japan .
62-150721  7/1987  Japan .

*Primary Examiner*—Robert Kim
*Attorney, Agent, or Firm*—Morgan, Lewis & Bockius LLP

[57] ABSTRACT

A method provides a technique for exposing a pattern on a mask that is held by a mask stage onto a substrate. The method includes a first step of detecting a mark on the mask that is held at a first position by the mask stage and determining a corresponding position of the mask stage; a second step of detecting the mark on the mask that is held at a second position different from the first position by the mask stage and determining a corresponding position of the mask stage; a third step of determining a position of the mask relative to the mask stage in accordance with the detection results in the first and second steps; a fourth step of aligning the mask with the substrate; and a fifth step of exposing the pattern on the mask onto the substrate.

23 Claims, 3 Drawing Sheets

POSITION CONTROL METHOD IN EXPOSURE APPARATUS

This is a continuation of application Ser. No. 08/826,740 filed on Apr. 4, 1997.

This application claims the benefit of Japanese Application No. 08-108367, filed on Apr. 4, 1996, which is hereby incorporated by reference.

BACKGROUND OF THE INVENTION

1. Field of the Invention

The present invention relates to a method of controlling the position of a mask in an exposure apparatus, and more particularly, to a method of controlling the position of a mask and a method for aligning the mask with a photosensitive substrate in an exposure apparatus having a mask stage whose position and angle in a two-dimensional plane are controlled by a mask interferometer.

2. Discussion of the Related Art

In a photolithography process in the manufacture of semiconductor devices, liquid crystal display devices, or the like, an exposure apparatus has been used for transferring a circuit pattern on a mask (reticle) onto a photosensitive substrate through a projection optical system. In particular, a step-and-repeat type reduction projection exposure apparatus (so-called "stepper") that drives the wafer stage serially or sequentially and operates in a batch exposing mode has been widely used.

In the reduction projection exposure apparatus of this type, when a circuit pattern on the reticle is projected on a wafer by exposure, the alignment between the wafer and the reticle in the rotational direction is performed in the following manner. Initially, searching alignment measurement is performed with respect to the wafer on a wafer holder, measuring the amount of rotation of the wafer from a reference position. On the basis of the measured result, the wafer holder is rotated so that the wafer is roughly aligned with the reticle. Then, fine alignment measurement is performed, and a reticle stage, which holds the reticle, is moved at the time of exposure so that the reticle is aligned with the wafer in the rotational direction with high accuracy.

In the conventional alignment method above, alignment in the rotational direction is implemented such that after the wafer holder is rotated, a remaining slight deviation in alignment between the wafer and the reticle in the rotating direction is removed by minutely rotating the reticle stage. One way to improve throughput is to combine the conventional two steps of operations for alignment in the rotational direction into one step, in particular, by unifying the two steps into operation of rotating only the reticle stage. Since a θ-stage, on which the wafer holder is mounted, is fixed onto an X stage by a vacuum chuck, the rotation of the wafer holder would require that this vacuum be turned off when rotating the θ-stage, and turned on again after the rotation. On the other hand, if only the reticle stage is rotated, such procedures are not required.

When the alignment in the rotating direction is performed by moving only the reticle stage, the amount of rotation of the reticle stage is considerably larger than that in the conventional method. It is difficult to rotate the reticle stage by a large amount without changing the conventional arrangement and alignment sequence, since such large rotation may degrade alignment accuracy for reasons as described below.

First, a reticle interferometer for measuring the position of the reticle typically measures a displacement of an apex in a corner mirror provided on the reticle stage in the direction parallel to the optical axis of a laser beam emitted from the reticle interferometer. Abbe error may occur if the apex of the corner mirror does not exist along the optical axis of the laser beam when the reticle stage is rotated.

Second, while the reticle is loaded by a reticle loader such that a reference edge of the reticle is positioned every time at the same place in the reticle stage, positioning errors may occur due to fluctuation of a pattern position on the reticle with respect to the reference edge of the reticle and poor reproducibility of the reticle position in loading the reticle. This results in positional variation of the reticle pattern with respect to the reticle stage. Accordingly, the position of the reticle stage need be adjusted to offset the variations so that the reticle pattern is brought into an optimum exposure position. As a result, the corner mirror of the interferometer (reticle interferometer) of the reticle stage inevitably deviates from the optical axis of the reticle interferometer. If a large amount of rotation is required in the reticle stage, the Abbe error may increase and the difference between the measured position of the reticle calculated through the reticle interferometer and the actual position of the reticle may increase, resulting in poor alignment accuracy.

SUMMARY OF THE INVENTION

Accordingly, the present invention is directed to a method of controlling the position of a mask that substantially obviates the problems due to limitations and disadvantages of the related art.

An object of the present invention is to provide a control method of positioning of the reticles that permits highly accurate control of the position of the mask even when the mask stage is rotated by a large amount.

Another object of the present invention is to provide an alignment method for aligning a mask with a photosensitive substrate with high throughput and with high alignment accuracy.

Additional features and advantages of the invention will be set forth in the description that follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the present invention provides a method of calibrating a plurality of directional position detectors each detecting a position of a corresponding detection point on a movable mask stage in an exposure apparatus along a predetermined direction, the method including the steps of moving the movable mask stage to a plurality of calibration positions; outputting calibration signals corresponding to each of the calibration positions; outputting a position signal from each of the directional position detectors for each of the calibration positions, the position signal indicating the position of each detection point on the movable mask stage along the predetermined direction at each of the plurality of calibration positions; and processing the calibration signals and the position signals to derive a relationship between an arbitrary position of the movable mask stage and corresponding position signals from the directional position detectors.

In another aspect, the present invention provides a method of determining positions of detection points relative to a movable mask stage in an exposure apparatus having a plurality of directional position detectors, each of the directional position detectors measuring the position of a corresponding detection point along a predetermined direction, the method including the steps of moving the movable mask stage to a plurality of calibration positions; outputting calibration signals corresponding to each of the calibration positions; outputting a position signal from each of the directional position detectors for each of the calibration positions, the position signal indicating the position of each detection point on the movable mask stage along the predetermined direction at each of the plurality of calibration positions; and processing the calibration signals and the position signals to derive the positions of the detection points relative to the movable mask stage.

In another aspect, the present invention provides a mask stage controller in an exposure apparatus, the mask stage controller including a mask stage movable in a two dimensional plane; a mask position detector outputting a first position signal indicating a position of the mask stage; a plurality of directional position detectors each outputting a second position signal indicating a position of a corresponding detection point on the mask stage along a predetermined direction; and a controller processing the first position signals and the second position signals to derive a relationship between an arbitrary position of the movable mask stage and corresponding first position signals from the mask directional position detectors.

In another aspect, the present invention provides a position control method for controlling a position of a mask on a mask stage in an exposure apparatus, a position of the mask stage in a two-dimensional plane being controlled by a mask interferometer, wherein the position of the mask is controlled based on a measurement value of the mask interferometer, including the steps of applying a first set of equations representing a relationship between a coordinate measurement value of the mask interferometer and the position and orientation of the mask stage, and applying a second set of equations representing a relationship between the position and orientation of the mask stage and a position and orientation of the mask.

In another aspect, the present invention provides a method for aligning a substrate on a substrate stage with a mask on a mask stage in an exposure apparatus, a position of the mask stage in a two-dimensional plane being controlled by a plurality of mask interferometers, each of which detects a position of a corresponding mirror on the mask stage along a predetermined direction, the method including the steps of (a) resetting the plurality of mask interferometers when the mask stage is moved to a predetermined initial positions; (b) placing a mask on the mask stage, the mask being fixed to the mask stage; (c) moving the mask stage to a plurality of calibration positions; (d) measuring a position of an alignment mark formed on the mask at each of the plurality of calibration positions; (e) outputting a first position signal from each of the plurality of mask interferometers at each of the plurality of calibration positions, the first position signal indicating a position of the corresponding mirror on the mask stage in the predetermined direction; (f) deriving a position of the mirror relative to the mask stage from the measured position of the alignment mark and the first position signal for each calibration positions; (g) measuring a position of the alignment mark on the mask when the mask stage is at a predetermined position to derive a position of the mask at the predetermined position of the mask stage; (h) outputting a second position signal from the mask interferometer at the predetermined position, the second position signal indicating a position of the corresponding mirror on the mask stage in the predetermined direction; (i) deriving the predetermined position of the mask stage from the second position signal outputted in the step (h) in accordance with the position of the mirror relative to the mask stage derived in the step (f); (j) deriving a position of the mask relative to the mask stage from the position of the mask derived in the step (g) and the position of the mask stage derived in the step (i); (k) replacing the substrate with another substrate; (l) measuring an angle of rotation of the another substrate in the two dimensional plane; and (m) rotating the mask stage in accordance with the angle of rotation of the another substrate measured in the step (l) and the position of the mask derived in the step (g) to rotationally align the mask with the another substrate.

In another aspect, the present invention provides a position control method for controlling a position of a mask mounted on a mask stage in an exposure apparatus including the mask stage whose position and orientation in a two-dimensional plane are controlled by a mask interferometer, wherein the position of the mask is controlled based on a measurement value of the mask interferometer, using an expression representing a relationship between a coordinate measurement value of the mask interferometer, and the position and orientation of the mask stage, and an expression representing a relationship between the position and orientation of the mask stage, and a position and orientation of the mask.

In a further aspect, the present invention provides an alignment method for aligning a photosensitive substrate mounted on a substrate stage with a mask mounted on a mask stage in an exposure apparatus including the substrate stage and the mask stage whose position and posture in a two-dimensional plane is controlled by a mask interferometer, the alignment method including a first step of resetting the mask interferometer while setting the mask stage in a predetermined initial position; a second step of replacing the mask on the mask stage with another mask; a third step of measuring a position of an alignment mark formed on the another mask, on a reference coordinate system provided by a coordinate system of the substrate stage, while moving the another mask by a predetermined distance in a predetermined direction, and calculating, based on the measured position of the alignment mark, a coordinate position of a mirror on the mask stage as viewed on the reference coordinate system when the mask stage is placed in the initial position, a position of the mirror being measured by the mask interferometer; a fourth step of detecting the alignment mark on the another mask by mark detector having an index mark, and thereby measuring a position and orientation of the another mask based on a deviation of the another mask from the index mark, while at the same time measuring a coordinate position of the another mask stage by the mask interferometer, so as to calculate the position and orientation of the mask stage using a result of measurement of the coordinate position of the mask stage, and the coordinate position of the mirror obtained in the third step; a fifth step of calculating a position of the another mask relative to the mask stage, based on the position and orientation of the another mask and the position and orientation of the mask stage obtained in the fourth step; a sixth step of replacing the substrate with another substrate, and effecting measurement of a rotating amount of the another substrate with respect to the reference coordinate system of the another substrate; and a seventh step of rotating the mask stage based on the rotating amount measured in the sixth step, and a rotating amount of the another mask is measured in the fourth step, so as to align the rotated positions of the another mask and the another substrate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
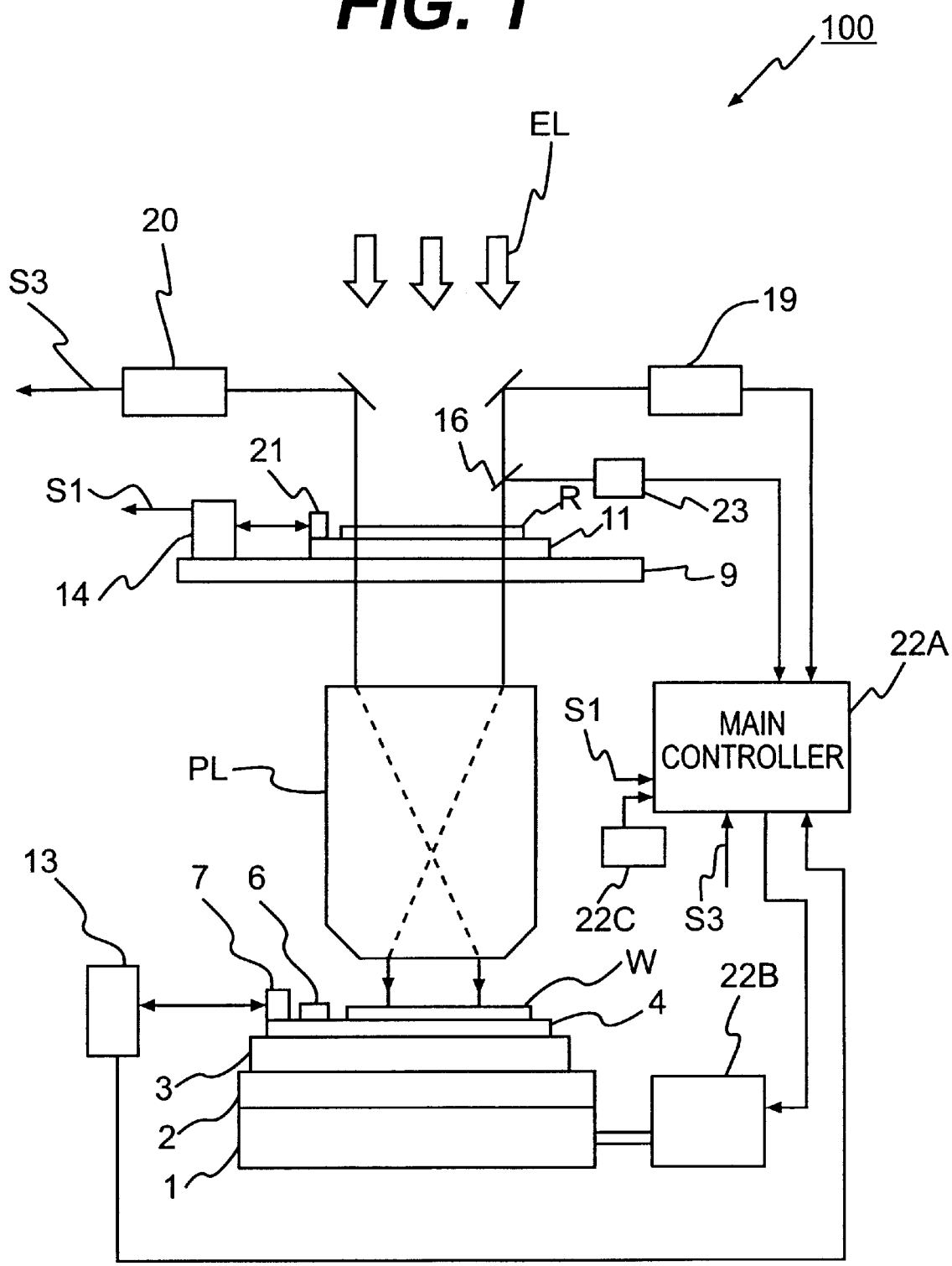
FIG. 1 is a schematic view showing the construction of an exposure apparatus according to a preferred embodiment of the present invention.

Referring to FIG. 1 through FIG. 4, a preferred embodiment of the present invention will be described. FIG. 1 schematically shows the construction of a reduction projection exposure apparatus 100 that operates in a step-and-repeat mode and performs a position control method and an alignment method according to the present invention.

In the reduction projection exposure apparatus 100, a substrate stage 4 is mounted over a wafer support 1. The substrate stage 4 holds a wafer W (photosensitive substitute), and is movable in a two-dimensional plane (in the X direction parallel to the plane of FIG. 1 and in the Y direction perpendicular to the plane of the sheet of FIG. 1). The exposure apparatus 100 further includes a projection optical system PL located above the substrate stage 4 and having the optical axis extending in the Z direction normal to the XY plane, and a reticle stage 11 located above the projection optical system PL and holding a reticle R (mask). This reticle stage 11 is minutely movable in a plane parallel to the moving plane of the substrate stage 4.

The reticle stage 11 is mounted on a reticle support 9, and the reticle R is held on the reticle stage 11 by a vacuum chuck (not shown) or the like. The reticle stage 11 is movable in a plane perpendicular to the optical axis of the projection optical system PL (the XY plane) and in the rotational direction (θ direction) by a minute distance. Thus, the position of the reticle R in the two-dimensional plane can be controlled with high accuracy. Movable mirrors, as represented by a single movable mirror 21 in FIG. 1, are disposed on the reticle stage 11, and the position of the reticle stage 11 in the X, Y, and θ directions is constantly monitored by an interferometer 14 disposed on the reticle support 9. A position signal S1 obtained at the interferometer 14 is supplied to a main controller 22A.

A Y direction wafer stage 2 that is movable in the Y direction is mounted on the wafer support 1, and an X direction wafer stage 3 that is movable in the X direction is mounted on the Y direction wafer stage 2. The substrate stage 4 is provided on the X direction wafer stage 3, and the wafer W is held on this substrate stage 4 by a vacuum chuck or the like.

Furthermore, the substrate stage 4 is minutely movable in the Z direction, which is the direction of the optical axis of the projection optical system PL, and can be rotated about the Z axis within a small range. A movable mirror 7 is fixed on the substrate stage 4 as shown in FIG. 1. (The movable mirror 7 in general includes a Y direction mirror extending in the X direction and an X direction mirror extending in the Y direction.) The position of the substrate stage 4 in the X, Y, and θ directions is monitored by an interferometer 13 installed outside of the substrate stage 4. (This interferometer 13 shown in FIG. 1 in general includes three interferometers: one interferometer for measuring the position of the stage 4 in the X direction and two interferometers for measuring the position of the stage 4 in the Y direction). The position signal obtained at the interferometer 13 is supplied to the main controller 22A. The main controller 22A controls the Y direction wafer stage 2, the X direction wafer stage 3, and the substrate stage 4, through a wafer driving device 22B or the like, and also controls the entire operation of the exposure apparatus.

A fiducial mark plate 6 is installed in the vicinity of the wafer W on the substrate stage 4. This plate 6 is utilized to coordinate a wafer coordinate system measured by the interferometer 13 and a reticle coordinate system measured by the interferometer 14. Various fiducial marks are formed on the fiducial mark plate 6. Some of the fiducial marks are illuminated from the rear side of the mark plate 6 by illumination light guided to the substrate stage, i.e., these fiducial marks are light-emitting fiducial marks.

The projection optical system PL is so-called a both-side telecentric system having a predetermined reduction rate 1/5, for example. This projection optical system PL is so placed that the surface of the wafer W becomes conjugate with the patterned surface of the reticle R. Focusing operations are performed by elevating the substrate stage 4 by a minute distance in the Z direction according to signals from a focal-point detecting system (not shown).

A pair of reticle alignment microscopes 19, 20 are installed above the reticle R to simultaneously observe alignment marks M1, M2 (reticle marks) formed on the reticle R (FIG. 3) and light-emitting fiducial marks (not shown) on the fiducial mark plate 6. The reticle alignment microscopes 19, 20 detect the reticle marks M1, M2, respectively, when the reticle marks M1, M2 are illuminated by a light beam coming through the light-emitting marks (or a region of the fiducial mark plate where no mark is present). The light-emitting mark is in turn illuminated from the rear side of the fiducial mark plate 6 by an illuminating beam EL introduced into the inside of the fiducial mark plate 6. Each of reticle alignment microscope 19, 20 has a light-receiver that employs image processor such as a CCD camera, and has a crisscross index mark (not shown) serving as a reference point of detection. Output signals generated at the reticle alignment microscopes 19, 20 are supplied to the main controller 22A.

Figure 2:
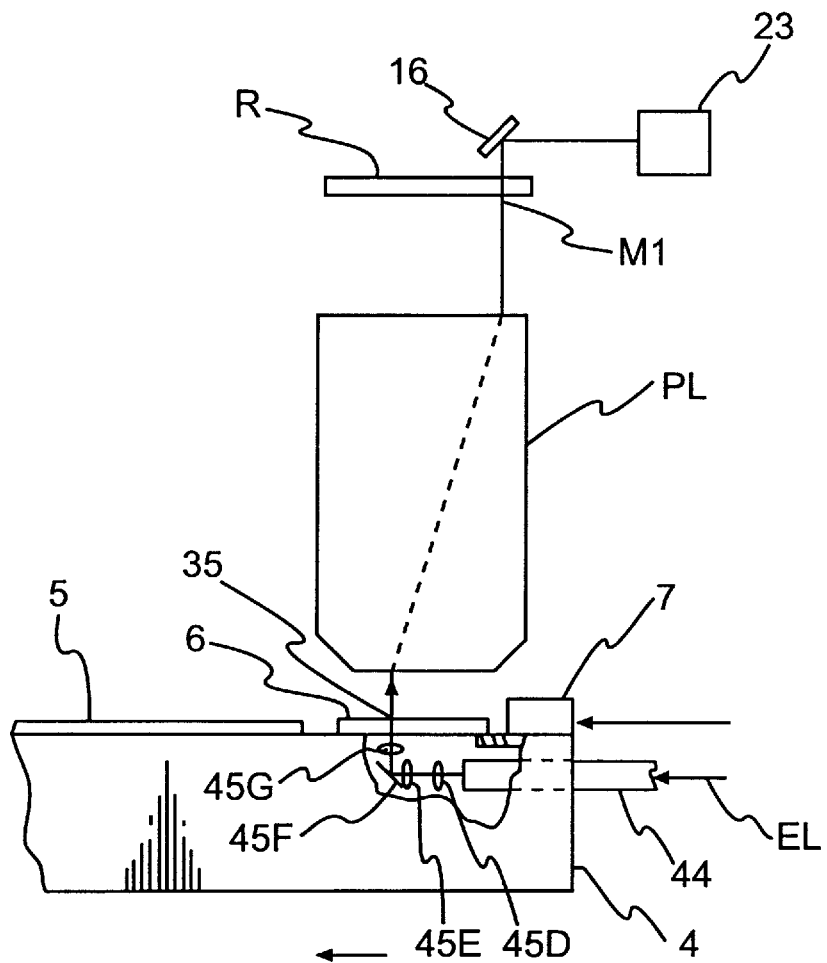
FIG. 2 is a schematic view showing the construction of a reticle alignment detecting system using light-emitting marks according to the preferred embodiment of the present invention.
Figure 3:
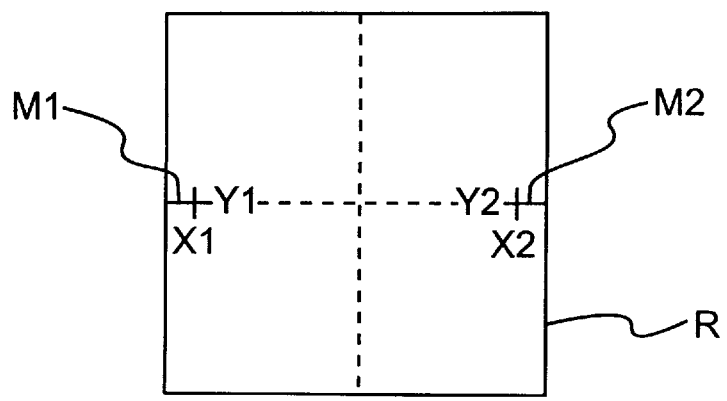
FIG. 3 is a plan view of a reticle according to the present embodiment.

In the present embodiment, a reticle alignment detecting system is provided for detecting the two-dimensional positions (in the X and Y directions) of the reticle marks M1, M2 on the reticle R with respect to the wafer coordinate system, using the light-emitting marks on the fiducial mark plate 6. FIG. 2 shows the construction of this reticle alignment detecting system. The illuminating beam EL having the same wavelength as that of exposing light is guided from the outside of the substrate stage 4 into the inside through an optical fiber 44. The exposing light may be relayed by a lens system to produce the illuminating beam EL, instead of using the optical fiber 44. The guided illuminating beam EL passes through a lens 45D, a lens 45E, a mirror 45F, and a lens 45G, and illuminates the fiducial mark 35. Although two or more of the slit-like light-emitting marks elongated in the X and Y directions are actually formed on the fiducial mark plate 6, these light-emitting marks are represented by a single light-emitting mark 35 in FIG. 2. In the following, the expression "light-emitting mark 35" is used to represent a plurality of light-emitting marks.

As shown in FIG. 2, the light transmitting through the fiducial mark 35 enters the projection optical system PL and forms an image of the fiducial mark 35 on the reticle mark M1 (or M2). The light from the reticle mark and the image of the fiducial mark 35 is incident on a light-receiving surface of a light-receiving sensor 23 through a beam splitter 16. Thus, the XY-coordinate position of the reticle mark M1 (or M2) on the reticle R with respects to a coordinate system fixed on the exposure apparatus can be detected by monitoring outputs of the light-receiving sensor 23 and outputs of the interferometers 13 while moving the substrate stage 4 in the X and Y directions.

With reference to FIG. 1, an off-axis type alignment device (not illustrated) for observing alignment marks (wafer marks) on the wafer W is provided on a side face of the projection optical system PL. A keyboard 22C is connected to the main controller 22A so that an operator can enter commands.

Figure 4A:
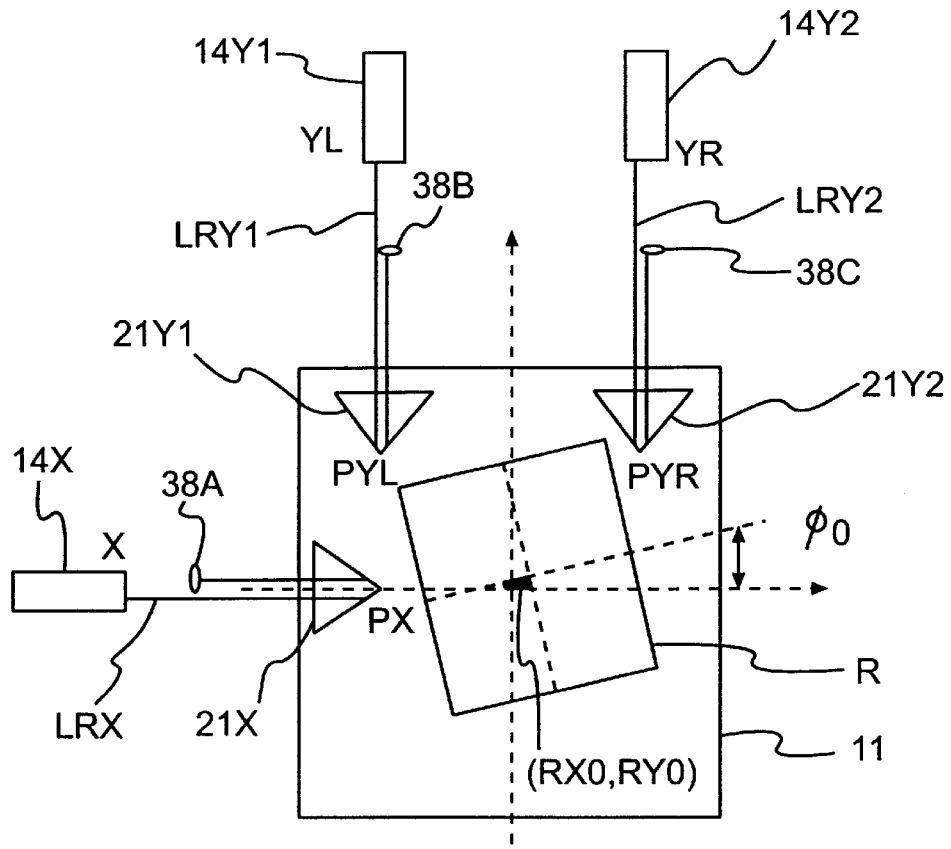
FIG. 4A is a plan view of a reticle stage including reticle interferometers.
Figure 4B:
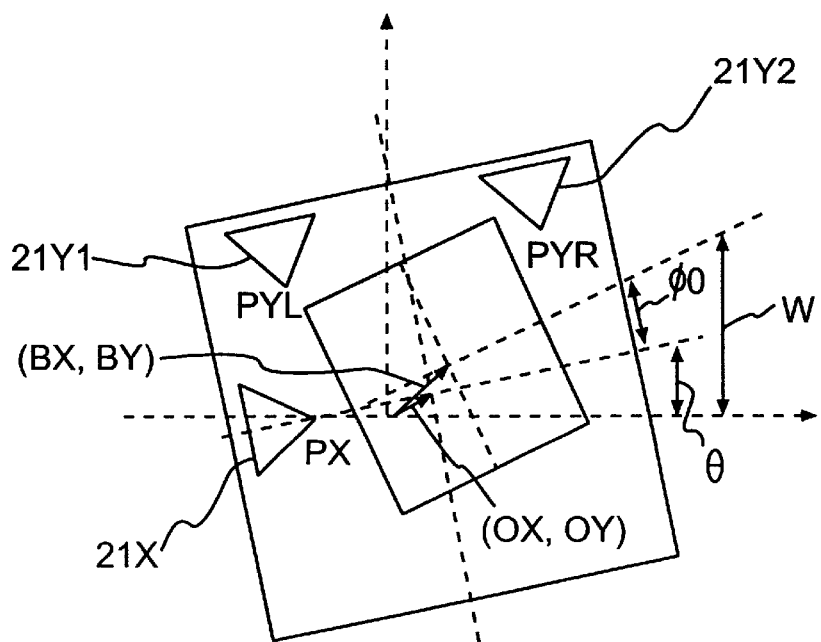
FIG. 4B is a plan view of the reticle stage defining various parameters used in describing the present embodiment.

FIG. 4A is a plan view of the reticle stage 11 holding the reticle R. An X direction mirror 21x and two Y direction mirrors 21y$_1$, 21y$_2$ are fixed to the reticle stage 11. The mirror 21x is illuminated by a laser beam LRx emitted from an X direction reticle interferometer 14x in the X direction. The mirrors 21y$_1$, 21y$_2$ are illuminated by laser beams LRy$_1$, LRy$_2$ emitted in the Y direction from Y direction reticle interferometers 14y$_1$ and 14y$_2$, respectively. In this embodiment, corner-cube-type reflecting elements (corner mirrors) are used as the mirrors 21x, 21y$_1$, and 21y$_2$. The laser beams LRx, LRy$_1$, LRy$_2$ reflected by the mirrors 21x, 21y$_1$, 21y$_2$ are incident on reflecting mirrors 38a, 38b, and 38c, respectively, and reflected to return the incoming paths. Thus, the reticle interferometers 14x, 14y$_1$, and 14y$_2$ are double-path interferometers measuring the positions of the apexes of the corresponding mirrors in respective directions. In this arrangement, the deviation of the laser beam from its ideal configuration due to rotation of the reticle stage is less likely to occur.

An exposure sequence of the exposure apparatus 100 will be described below.

Step 1: The reticle stage 11 is returned to a predetermined reset position Ox=Oy=θ=0, i.e., the origin of the wafer stage coordinate system (See FIG. 4A.). Here, (Ox, Oy) are the coordinates of the center of the reticle state 11, and θ is the angle of rotation of the reticle stage 11. At this point, all the reticle interferometers 14x, 14y$_1$, and 14y$_2$ are reset to yield the measurement values X=Y$_L$=Y$_R$=0.

Step 2: The reticle is then replaced by a new reticle R by a reticle feeder and reticle replacements mechanism (not shown). That is the new reticle R is loaded on the reticle stage 11.

Step 3: Subsequently, alignment of the reticle R is carried out. The substrate stage 4 is moved so that a region on the fiducial mark plate 6, in which no mark is present, is positioned within an exposure field of the projection optical system PL. The marks M1, M2 on the reticle R are observed by the reticle alignment microscopes 19, 20 to detect positional deviations of these marks M1, M2 from the respective index marks in the reticle alignment microscopes 19, 20. The reticle stage 11 is minutely driven to offset the positional deviations.

Step 4: Then, the reticle interferometers are calibrated. The calibration of the reticle interferometers is to determine the positions (P$_{10X}$, P$_{10Y}$), (P$_{20X}$, P$_{20Y}$), (P$_{30X}$, P$_{30Y}$) of the apexes P$_X$, P$_{YL}$, P$_{YR}$ of the mirrors 21x, 21y$_1$, 21y$_2$ relative to the coordinate system fixed on the reticle stage 11 when the reticle stage 11 is positioned at the origin (Ox=Oy=θ=0, X=Y$_L$=Y$_R$=0). This is necessary because, as it is, the readings of the reticle interferometers may not exactly correspond to the actual position of the reticle stage.

The following equations (1a), (1b), (1c) define the relationship between the measurement values X, Y$_L$, Y$_R$ of the reticle interferometers 14x, 14y$_1$, and 14y$_2$ and the position (Ox, Oy, θ) of the reticle stage 11. (The position of the reticle stage includes the translational and rotational position). Once the positions (P$_{10X}$, P$_{10Y}$), (P$_{20X}$, P$_{20Y}$), (P$_{30X}$, P$_{30Y}$) of the apexes P$_X$, P$_{YL}$, P$_{YR}$ of the mirrors 21x, 21y$_1$, 21y$_2$ are obtained, the position of the reticle stage 11 can be controlled based on the measurement values of the reticle interferometers 14 according to the expressions (2a), (2b), (2c) obtained by solving the expressions (1a), (1b), (1c) in terms of O$_x$, O$_y$, and θ (equations (2b), (2c), (2d)).

$$X = P_{10X}(\cos\theta - 1) - P_{10Y} \cdot \sin\theta + O_X \quad (1a)$$

$$Y_L = P_{20X} \cdot \sin\theta + P_{20Y}(\cos\theta - 1) + O_Y \quad (1b)$$

$$Y_R = P_{30X} \cdot \sin\theta + P_{30Y}(\cos\theta - 1) + O_Y \quad (1c)$$

$$O_X = -P_{10X}(\cos\theta - 1) + P_{10Y} \cdot \sin\theta + X \quad (2a)$$

$$O_Y = \frac{Y_L + Y_R - (P_{20X} + P_{30X})\sin\theta - (P_{20Y} + P_{30Y}) \cdot (\cos\theta - 1)}{2} \quad (2b)$$

$$\theta = \sin^{-1}\frac{(\Delta Y + \Delta P_Y)\Delta P_X - \Delta P_Y(\Delta P_X^2 - \Delta Y^2 - 2\Delta Y \cdot \Delta P_Y)^{\frac{1}{2}}}{\Delta P_X^2 + P_Y^2} \quad (2c)$$

where, $$\Delta Y = Y_R - Y_L \quad (2d)$$

$$\Delta P_X = P_{30X} - P_{20X} = \text{constant} \quad (2e)$$

$$\Delta P_Y = P_{30Y} - P_{20Y} = \text{constant} \quad (2f)$$

According to the equations (1a) to (1c), the positions of the apexes (P$_X$, P$_{YL}$, P$_{YR}$) of the mirrors 21x, 21y$_1$, 21y$_2$ can be only estimated if X, Y$_L$, Y$_R$ and O$_X$, O$_Y$, θ are known. However, the parameters O$_X$, O$_Y$, θ cannot be directly measured. To estimate these parameters O$_X$, O$_Y$, θ, the following procedure is implemented.

The reticle stage 11 is moved to a plurality of calibration positions so that output values of the reticle interferometers 14x, 14y$_1$, 14y$_2$ become X=0, Y$_{Li}$=i×ΔY', and Y$_{Ri}$=−i×ΔY' (where, ΔY' is a constant and i is an integer). With the reticle stage 11 being moved the positions (X$_{1i}$, Y$_{1i}$), (X$_{2i}$, Y$_{2i}$) of the reticle marks M1, M2 are measured using the reticle alignment detecting system. At each calibration position of the reticle stage 11, the main controller 22A positions the substrate stage 4 in the X and Y directions, and monitors the outputs of the interferometers 13 and outputs of the light-receiving sensor 23 to measure the positions $(X_{1i}, Y_{1i}, )$, $(X_{2i}, Y_{2i})$ of the reticle marks M1, M2 on the reticle stage 11. The measured positions are stored in a memory (not shown). This measurement is performed by varying the "i" value from –N to N (N is a positive integer), and the results of the measurement at the respective positions of the reticle stage 11 are successively stored in the memory.

The best-estimated actual position of the reticle stage 11 based on the measurement values $X_{1i}, Y_{1i}, X_{2i}, Y_{2i}$ (i=–N to N) are given by the following equations at each of the calibration positions.

$$O_{Xi} = \frac{(X_{1i} + X_{2i}) - (X_{10} + X_{20})\cos\theta_i + (Y_{10} + Y_{20})\sin\theta_i}{2} \quad (3a)$$

$$O_{Yi} = \frac{(Y_{1i} + Y_{2i}) - (X_{10} + X_{20})\sin\theta_i - (Y_{10} + Y_{20})\cos\theta_i}{2} \quad (3b)$$

$$\begin{pmatrix}\cos\theta_i \\ \sin\theta_i\end{pmatrix} = \frac{1}{(X_{20} - X_{10})^2 + (Y_{20} - Y_{10})^2} \quad (3c)$$
$$\begin{pmatrix} X_{20} - X_{10} & Y_{20} - Y_{10} \\ -Y_{20} + Y_{10} & X_{20} - X_{10} \end{pmatrix} \times \begin{pmatrix} X_{2i} - X_{1i} \\ Y_{2i} - Y_{1i} \end{pmatrix}$$

In the above equations, $(X_{10}, Y_{10})$ and $(X_{20}, Y_{20})$ are the positions of the reticle marks M1, M2 measured by the reticle alignment detecting system when the reticle stage 11 is at the origin (i=0), and $X_{1i}, Y_{1i}, X_{2i},$ and $Y_{2i}$, are the positions of the reticle marks M1, M2 measured by the reticle alignment detecting system when the reticle stage 11 is moved (X=0, $Y_{Li}$=i×ΔY', $Y_{Ri}$=–i×ΔY').

From the relationship between the position $(O_{Xi}, O_{Yi}, \theta_i)$ of the reticle stage 11 and the position $(X, Y_{Li}, Y_{Ri})$ of the reticle interferometers 14 for each i, the constants $(P_{10X}, P_{10Y}), (P_{20X}, P_{20Y}), (P_{30X}, P_{30Y})$ in the equations (1a), (1b), (1c) can be obtained. For example, the least square method can be used for this estimation as follows:

Using the position $(O_{Xi}, O_{Yi}, \theta_i)$ of the reticle stage 11 obtained according to the above-indicated equations (3a)–(3c), errors $eX_i, eY_{Li}, eY_{Ri}$ associated with a model equation (equations (1a) to (1c)) in the outputs of the reticle interferometers $X_i, Y_{Li}, Y_{Ri}$ can be represented as follows:

$$eX_i = X_i - P_{10X}(\cos\theta_i - 1) + P_{10Y} \cdot \sin\theta_i - O_{Xi} \quad (4a)$$

$$eY_{Li} = Y_{Li} - P_{20X} \cdot \sin\theta_i - P_{20Y}(\cos\theta_i - 1) - O_{Yi} \quad (4b)$$

$$eY_{Ri} = Y_{Ri} - P_{30X} \cdot \sin\theta_i - P_{30Y}(\cos\theta_i - 1) - O_{Yi} \quad (4c)$$

Accordingly, the sum of squares of the errors in the model equation is represented by, $$S = \sum_{i=-N}^{N} ((eX_i)^2 + (eY_{Li})^2 + (eY_{Ri})^2). \quad (5)$$

Parameters $P_{10X}, P_{10Y}, P_{20X}, P_{20Y}, P_{30X}, P_{30Y}$ that make S minimum provide the best-estimated constants $(P_{10X}, P_{10Y}), (P_{20X}, P_{20Y}), (P_{30X}, P_{30Y})$ in the equations (1a) to (1c). The coordinates $(P_{10X}, P_{10Y}), (P_{20X}, P_{20Y}), (P_{30X}, P_{30Y})$ represent the positions of the apexes $P_X, P_{YL}, P_{YR}$ of the mirrors $21x$, $21y_1, 21y_2$ on the reticle stage 11 when the reticle stage 11 is positioned at the origin (Ox=Oy=θ=0, X=$Y_L$=$Y_R$=0). (In other words, they are the positions of the apexes relative to the reticle stage.)

The accuracy of the values $(P_{10X}, P_{10Y}), (P_{20X}, P_{20Y}), (P_{30X}, P_{30Y})$ can be improved by increasing the value of the positive integer N. The positions $(P_{10X}, P_{10Y}), (P_{20X}, P_{20Y}), (P_{30X}, P_{30Y})$ of the apexes $P_X, P_{YL}, P_{YR}$ of the mirrors on the reticle stage 11 may vary due to poor reproducibility of the reset position of the reticle stage 11. (The position of the origin with respect to the reticle stage 11 may change for each reset operation.) Therefore, when the reticle interferometers 14 are reset, it is desirable to perform this calibrating operation to refresh the values of $(P_{10X}, P_{10Y}), (P_{20X}, P_{20Y}), (P_{30X}, P_{30Y})$.

According to the above-mentioned method, the relationship between the measurement values $(X, Y_L, Y_R)$ of the reticle interferometers and the position $(O_X, O_Y, \theta)$ of the reticle stage is obtained with high accuracy by equations (2a), (2b), (2c).

Step 5: Subsequently, a base line is measured. The substrate stage 4 is moved to align the reticle marks M1, M2 with the fiducial marks on the fiducial mark plate 6, and these marks are simultaneously observed by the reticle alignment microscopes 19, 20, to measure deviations of the positions of the reticle marks M1, M2 from the conjugate images of the fiducial marks. Then, the substrate stage 4 is moved by a distance equal to a design value of the base line—a distance between a reference point in the exposure field of the projection optical system (center of exposure, for example) and a reference point in an observation region of the off-axis type alignment device (not shown). The off-axis type alignment device then measures deviations of the reticle marks M1, M2 from the corresponding reference marks on the reference mark plate, and calculates the base line based on these deviations.

In this Step 5, when the reticle marks M1, M2 and the corresponding fiducial marks on the fiducial mark plate 6 are simultaneously observed by the reticle alignment microscopes 19, 20, the position $(R_{X0}, R_{Y0}, \phi_0)$ of the reticle R relative to the reticle stage 11 (FIG. 4A) are obtained.

In this measurement, deviations $(B_{X0}, B_{Y0}, \omega_0)$ of the reticle from respective index marks (reticle alignment index marks) are measured using the reticle alignment microscopes 19, 20. At the same time, the position and orientation $(O_{X0}, O_{Y0}, \theta_0)$ of the reticle stage 11 are calculated using the measurement values of the reticle interferometers 14x, $14y_1$, $14y_2$ and the expressions (2a), (2b), (2c). The following relationships exist among $(R_{X0}, R_{Y0}, \phi_0), (B_{X0}, B_{Y0}, \omega_0),$ and $(O_{X0}, O_{Y0}, \theta_0)$ (refer to FIGS. 4(A), 4(B)).

$$R_{X0} = (B_{X0} - O_{X0})\cos\theta_0 + (B_{Y0} - O_{Y0})\sin\theta_0 \quad (6a)$$

$$R_{Y0} = -(B_{X0} - O_{X0})\sin\theta_0 + (B_{Y0} O_{Y0})\cos\theta_0 \quad (6b)$$

$$\phi_0 = \omega_0 - \theta_0 \quad (6c)$$

Accordingly, the position and orientation $(R_{X0}, R_{Y0}, \phi_0)$ of the reticle R relative to the reticle stage 11 can be obtained.

In addition, the relationships represented by the following equations generally exist between the position and orientation $(O_X, O_Y, \theta)$ of the reticle stage 11 and the position and orientation $(B_X, B_Y, \omega)$ of the reticle R (FIG. 4B):

$$B_X = R_{X0} \cdot \cos\theta - R_{Y0} \cdot \sin\theta + O_X \quad (7a)$$

$$B_Y = R_{X0} \cdot \sin\theta + R_{Y0} \cdot \cos\theta + O_Y \quad (7b)$$

Accordingly, the position of the reticle R on the reticle stage 11 can be determined with high accuracy based on the measurement values of the reticle interferometers 14x, $14y_1$, $14y_2$.

Step 6: Upon completion of the base line check above, the wafer W is loaded and search alignment of the wafer W is performed. Then, the angle of rotation ζ of the wafer W is measured by fine alignment of the wafer W. As an example of the fine alignment, an enhanced global alignment (EGA) may be performed by an off-axis type alignment device, in which the array of all shot areas on the wafer are computed by statical processing of data obtained by detecting alignment marks on a predetermined set of shot areas and design data of the shot array using the least square method.

Since the angle of rotation ω of the reticle is obtained in the previous step of checking the base line, the wafer is not rotated in this step, and only the reticle stage is rotated by an amount (ζ–ω) so that the orientation of the reticle R coincides with that of the wafer W. The reticle stage 11 is driven by servo-controlling method or the like so that the measurement values at the reticle interferometers $14x$, $14y_1$, $14y_2$ become equal to target values. Such target values can be accurately obtained by solving the equations (2a)–(2f), (6a)–(6c), and (7a)–(7c).

Step 7: After the above-described operations are performed, an exposure operation starts.

As explained above, according to the present embodiment, the position of the reticle R can be controlled with high accuracy, based on the measurement values of the reticle interferometers. The present embodiment also makes it possible to align the reticle R with the wafer W with high accuracy without the step of rotating the substrate stage 4. Accordingly, improved throughput can be achieved while maintaining high alignment accuracy.

Moreover, the construction of the substrate stage can be simplified, since the rotational operation of the substrate stage 4 is not necessary.

In the present embodiment above, the reticle alignment detecting system is used for detecting the positions of the reticle marks M1, M2, and at the same time, the substrate stage 4 is moved in the two-dimensional plane. This detecting system may be replaced by a stationary-type detecting system that does not require the movement of the substrate stage 4 upon detecting the positions of the reticle marks.

As explained above, according to the position control method of the present invention, the position of the mask can be controlled with high accuracy based on measurement values of mask interferometers even when a relatively large rotation of the mask stage is required.

According to the above-described method, setting-up of the initial position of the mask stage, replacement of the mask, and calibration of the mask interferometer are performed in the first through fourth steps. In the fourth step, the position of the mask stage on the reference coordinate system are calculated. In the fifth step, the position of the mask with respect to the mask stage is obtained. In the sixth step, the substrate is replaced and the rotation of the substrate is measured. Then the mask stage is rotated based on the measured rotating amount of the substrate and the rotating amount of the mask measured in the fourth step, so that the mask is aligned with the substrate with high accuracy.

The above-described method makes it possible to align the mask with the substrate by rotating only the mask stage (no rotation of the substrate stage). Thus, the throughput can be improved as compared with the conventional two-step alignment.

In the above method, the operation of determining the mask position relative to the mask stage is performed at the same time as measurement of a base line, which is also advantageous in terms of the throughput.

Furthermore, according to the alignment method of the present invention, the mask can be aligned with the photosensitive substrate with high accuracy and with high throughput, which was not possible in the conventional method.

It will be apparent to those skilled in the art that various modifications and variations can be made in the position control method of the present invention without departing from the spirit or scope of the invention. Thus, it is intended that the present invention cover the modifications and variations of this invention provided they come within the scope of the appended claims and their equivalents.

What is claimed is:

1. A method for exposing a pattern of a mask that is held by a mask stage onto a substrate, the method comprising:
    a first step of measuring a position of a mark on the mask that is held by the mask stage at a first position and detecting first positional information corresponding to the first position of the mask stage;
    a second step of measuring a position of the mark on the mask that is held by the mask stage at a second position different from the first position and detecting second positional information corresponding to the second position of the mask stage;
    a third step of determining a relative positional relationship between the mask and the mask stage and an attitude of the mask stage based on the position of the mark measured in the first step, the first positional information, the position of the mark measured in the second step, and the second positional information;
    a fourth step of positioning the mask with respect to the substrate in accordance with the relative positional relationship and the attitude of the mask stage; and
    a fifth step of exposing the pattern of the mask onto the substrate.

2. The method according to claim 1, wherein the detection of the first and second positional information in the first and second steps is conducted using a position detection device.

3. The method according to claim 2, wherein the position detection device includes an interferometer.

4. The method according to claim 2, wherein the mask stage has an optical member included in the position detection device.

5. The method according to claim 4, wherein the optical member is a corner-cube mirror.

6. The method according to claim 1, wherein the fourth step includes the step of correcting a rotational error between the mask and the substrate by driving the mask stage.

7. A method of making an exposure apparatus which transfers a pattern of a mask onto an object, comprising the steps of:
    providing a transfer device between the mask and the object to transfer the pattern onto the object;
    providing a position detection device which detects a first position of the mask stage, at least part of the position detection device being fixed to the mask stage;
    providing a mark detection device which detects a mark formed on the mask, the mark detection device being disposed across from the mask;
    providing a controller which is connected to the position detection device and the mark detection device, wherein the controller detects positions of the mask stage and positions of the mark on the mask held by the mask stage at each of a plurality of positions, and wherein the controller determines positions of the mask stage and the mark after the mask stage is moved to a second position different than the first position, thereby enabling detection of a position of the mask relative to the mask stage in accordance with the detection results of the position detection device.

8. The method according to claim 7, wherein the position detection device includes an interferometer.

9. The method according to claim 7, wherein the mask stage has an optical member included in the position detection device.

10. The method according to claim 9, wherein the optical member is a corner-cube mirror.

11. The method according to claim 9, wherein the mask stage moves rotationally to correct a rotational error between the mask and the object.

12. The method according to claim 7, wherein the exposure apparatus is a step-and-repeat exposure apparatus.

13. The method according to claim 1, wherein the fourth step includes the steps of:

deriving a rotation amount of the mask stage relative to the mask; and correcting an error that occurs during alignment between the mask and the substrate due to said rotational amount of the mask stage.

14. The method according to claim 13, wherein the correcting step of the fourth step includes driving the mask stage to correct the error during the alignment between the mask stage and the substrate due to the rotational amount of the mask stage.

15. The method according to claim 14, wherein the correcting step of the fourth step includes driving the mask stage to correct a rotational component of the error during the alignment between the mask and the substrate due to the rotation amount.

16. A method for exposing a pattern on a mask that is held by a mask stage onto a substrate, the method comprising the steps of:

calculating a position of the mask relative the mask stage in accordance with a position of a mark on the mask and a position of the mask stage holding the mask;

aligning the mask with the substrate in accordance with the position of the mask relative to the mask stage calculated in the step of calculating and a position of mask stage; and a step of exposing the pattern on the mask onto the substrate.

17. The method according to claim 16, wherein the aligning step includes the steps of:

deriving a rotation amount of the mask stage relative to the mask; and correcting an error that occurs during alignment between the mask and the substrate due to said rotational amount of the mask stage.

18. The method according to claim 1, wherein in said fourth step, the mask is positioned by controlling the position of the mask stage based on information determined in said third step, including the relative position relationship and the attitude of said mask stage.

19. The method according to claim 1, wherein in the second step, the mask stage is moved from the first position of the mask stage in the first step to the position by a specific rotational amount by rotating the mask stage about a particular position.

20. The method according to claim 1, wherein in the fourth step, the difference between a coordinate system of the substrate stage holding the substrate and a coordinate system of the mask stage is measured in advance, wherein the position of the mask in the fourth step is determined by controlling the position of the mask stage based on the positional information thereof.

21. The method according to claim 1, wherein the first, second and third steps are repeated every time the mask stage is moved to a neutral position to reset a mask interferometer for measuring the position of said mask stage.

22. The method according to claim 1, wherein in the fourth step, a target value is established with respect to a value to be detected by a mask interferometer for measuring the position of the mask stage so that the mask is placed at a predetermined position relative to the substrate.

23. A method for exposing a pattern of a mask that is held by a mask stage onto a substrate, the method comprising:

a first step of measuring a position of the mask stage using a mask stage interferometer while detecting a mark formed on the mask to determine the position of the mask;

a second step, based on the measurement by the mask stage interferometer and the determined position of the mask, of determining a relative relationship between the measurement by the mask stage interferometer and the position/rotation of the mask stage, and determining a relative relationship between the mask stage and the mask in terms with respect to their respective positions and rotations;

a third step of obtaining a measurement error corresponding to an amount of rotation of the mask stage, which is included in the measurement by the mask stage interferometer, when the mask is positioned at a specific position based on the relative relationships obtained in the second step;

a fourth step in which the position of the mask is positioned relative to the substrate based on the measurement by the mask stage interferometer using the results obtained in the second and third steps; and a fifth step of exposing the pattern of the mask onto the substrate.

* * * * *